(12) United States Patent
Choi et al.

(10) Patent No.: US 9,209,313 B2
(45) Date of Patent: Dec. 8, 2015

(54) THIN FILM TRANSISTOR ARRAY PANEL HAVING DOUBLE-LAYERED OXIDE SEMICONDUCTOR STRUCTURE AND METHOD FOR MANUFACTURING THE SAME

(71) Applicant: Samsung Display Co., Ltd., Yongin, Gyeonggi-Do (KR)

(72) Inventors: Young Joo Choi, Anyang-si (KR); Joon Geol Kim, Hwaseong-si (KR); Seung-Ho Jung, Yongin-si (KR); Kang Moon Jo, Seoul (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/291,535

(22) Filed: May 30, 2014

(65) Prior Publication Data

US 2015/0144939 A1 May 28, 2015

(30) Foreign Application Priority Data

Nov. 28, 2013 (KR) .......................... 10-2013-0145937

(51) Int. Cl.
| | | |
|---|---|---|
| *G02F 1/1343* | (2006.01) | |
| *H01L 29/786* | (2006.01) | |
| *H01L 29/66* | (2006.01) | |
| *H01L 27/12* | (2006.01) | |

(52) U.S. Cl.
CPC ........ *H01L 29/7869* (2013.01); *H01L 27/1225* (2013.01); *H01L 27/1259* (2013.01); *H01L 29/66742* (2013.01)

(58) Field of Classification Search
CPC ........................... H01L 27/3262; H01L 27/283
USPC ................... 257/40, 43; 438/99, 158; 349/43
See application file for complete search history.

(56) References Cited

U.S. PATENT DOCUMENTS

| | | |
|---|---|---|
| 8,395,157 B2 | 3/2013 | Park et al. |
| 2011/0220879 A1 | 9/2011 | Im et al. |
| 2012/0169985 A1* | 7/2012 | Kim et al. .................... 349/139 |
| 2013/0228772 A1 | 9/2013 | Choi et al. |

FOREIGN PATENT DOCUMENTS

| | | |
|---|---|---|
| JP | 2010-062549 A | 3/2010 |
| KR | 1020090058167 A | 6/2009 |
| KR | 1020100069432 A | 6/2010 |

(Continued)

*Primary Examiner* — Selim Ahmed
*Assistant Examiner* — Changhyun Yi
(74) *Attorney, Agent, or Firm* — Cantor Colburn LLP

(57) ABSTRACT

A thin film transistor array panel includes: a gate line including a gate electrode; a first gate insulating layer on the gate line; a semiconductor layer on the first gate insulating layer and overlapping the gate electrode; a second gate insulating layer on the semiconductor layer and the first gate insulating layer, and an opening in the second gate insulating layer and through which the semiconductor layer is exposed; drain and source electrodes on the second gate insulating and semiconductor layers and facing each other; a first field generating electrode; and a second field generating electrode connected to the drain electrode. The semiconductor layer includes an oxide semiconductor layer, and first and second auxiliary layers on the oxide semiconductor layer and separated from each other. An edge of the drain and source electrodes is disposed inside an edge of the first and second auxiliary layers, respectively.

20 Claims, 18 Drawing Sheets

(56) References Cited

FOREIGN PATENT DOCUMENTS

| KR | 1020110101771 A | 9/2011 |
|---|---|---|
| KR | 101108176 B1 | 1/2012 |
| KR | 1020130012741 A | 2/2013 |
| KR | 1020130102666 A | 9/2013 |

* cited by examiner

THIN FILM TRANSISTOR ARRAY PANEL HAVING DOUBLE-LAYERED OXIDE SEMICONDUCTOR STRUCTURE AND METHOD FOR MANUFACTURING THE SAME

This application claims priority to Korean Patent Application No. 10-2013-0145937 filed on Nov. 28, 2013, and all the benefits accruing therefrom under 35 U.S.C. §119, the entire contents of which are incorporated herein by reference.

BACKGROUND (a) Field

The invention relates to a thin film transistor and a method for manufacturing the same.

(b) Description of the Related Art

A liquid crystal display is one of the flat panel displays which have been most widely used. The liquid crystal display includes two sheets of display panels in which field generating electrodes, such as a pixel electrode and a common electrode, are disposed and a liquid crystal layer interposed therebetween. The liquid crystal display displays an image by applying a voltage to the field generating electrodes to generate an electric field in the liquid crystal layer, determining an orientation of liquid crystal molecules of the liquid crystal layer based on the generated electric field, and controlling a polarization of incident light.

In the liquid crystal display, each of the two field generating electrodes which generate the electric field in the liquid crystal layer may be disposed on a single one of the display panels, such as a thin film transistor array panel.

The thin film transistor array panel includes a plurality of thin film transistors, in which the thin film transistor is configured of a gate electrode connected to a gate line, a source electrode connected to a data line, a drain electrode connected to a pixel electrode, a semiconductor layer which is disposed on the gate electrode between the source electrode and the drain electrode, and the like, and transmits a data signal from a data line to the pixel electrode depending on a gate signal from the gate line.

A semiconductor is an important factor which determines characteristics of the thin film transistor. As the semiconductor, amorphous silicon has been mainly used; however, since the amorphous silicon has low charge mobility, there is a limitation in manufacturing a high-performance thin film transistor. Further, since the polysilicon has high charge mobility and the high performance thin film transistor is easily manufactured, but cost is increased and uniformity is reduced, there is a limitation in manufacturing a relatively large thin film transistor array panel.

Therefore, research into a thin film transistor using an oxide semiconductor which has the electron mobility and an on/off ratio of current higher than amorphous silicon, is cheaper and has the uniformity higher than polysilicon, has been conducted.

SUMMARY

One or more exemplary embodiment secures characteristics of a thin film transistor, in a thin film transistor array panel including an oxide semiconductor and two field generating electrodes.

An exemplary embodiment of the invention provides a thin film transistor array panel, including: an insulating substrate; a gate line on the insulating substrate and including a gate electrode; a reference voltage line on the insulating substrate, separated from the gate line and including an extension; a first gate insulating layer on the insulating substrate, the gate line and the reference voltage line; a semiconductor layer on the first gate insulating layer and overlapping the gate electrode; a second gate insulating layer on the semiconductor layer and the first gate insulating layer, and a semiconductor opening defined in the second gate insulating layer and through which the semiconductor layer is exposed; a data line including a source electrode; a drain electrode on the second gate insulating layer and the semiconductor layer and facing the source electrode; a first passivation layer on the data line, the drain electrode and the second gate insulating layer; a second passivation layer on the first passivation layer; a first field generating electrode on the second passivation layer; a third passivation layer on the first field generating electrode; a first contact hole defined in the first passivation layer, the second passivation layer and the third passivation layer and exposing the drain electrode; and a second field generating electrode on the third passivation layer and connected to the drain electrode through the first contact hole. The semiconductor layer includes an oxide semiconductor layer, and a first auxiliary layer and a second auxiliary layer on the oxide semiconductor layer and separated from each other. An edge of the drain electrode exposes an edge of the first auxiliary layer, and an edge of the source electrode exposes an edge of the second auxiliary layer.

The first gate insulating layer, the second gate insulating layer and the first passivation layer may include silicon oxide.

The first auxiliary layer and the second auxiliary layer may include titanium, molybdenum or an alloy of titanium-molybdenum.

A second contact hole may be defined in the first gate insulating layer, the second gate insulating layer, the first passivation layer and the second passivation layer and through which the extension is exposed.

The first field generating electrode may be connected to the extension through the second contact hole.

The second field generating electrode may include a plurality of branch electrodes, and horizontal portions connecting the plurality of branch electrodes to each other.

The second passivation layer may include an organic insulating material.

The thin film transistor array panel may further include a resistance electrode including a same material as the data line and in a same layer as the data line.

The resistance electrode may overlap the gate line.

A third contact hole may be defined in the first passivation layer and the second passivation layer and through which the resistance electrode is exposed.

The first field generating electrode may be connected to the resistance electrode through the third contact hole.

Another exemplary embodiment of the invention provides a method for manufacturing a thin film transistor array panel, including: forming a gate line including a gate electrode, and a reference voltage line separated from the gate line and including an extension, on an insulating substrate; forming a first gate insulating layer on the insulating substrate, the gate line, and the reference voltage line; sequentially forming an oxide semiconductor layer and an auxiliary material layer on, the first gate insulating layer; forming a second gate insulating layer on the auxiliary material layer and the first gate insulating layer, and a semiconductor opening defined in the second gate insulating layer and through which the auxiliary material layer is exposed; forming a data metal layer on the second gate insulating layer and the exposed auxiliary material layer; forming a data line including a source electrode, drain electrode facing the source electrode, and a resistance electrode, by etching the data metal layer; forming a first auxiliary layer and a second auxiliary layer exposing the oxide semiconductor layer by etching the auxiliary material layer; sequentially forming a first passivation layer and a second passivation layer on the data line, the drain electrode, the resistance electrode and the exposed oxide semiconductor layer; forming a first field generating electrode on the second passivation layer; forming a third passivation layer on the first field generating electrode; and forming a second field generating electrode connected to the drain electrode on the third passivation layer. An edge of the drain electrode exposes an edge of the first auxiliary layer, and an edge of the source electrode exposes an edge of the second auxiliary layer.

The etching the data metal layer may include a wet etch and the etching the auxiliary material layer may include a dry etch.

The forming the second field generating electrode may include forming a plurality of branch electrodes, and horizontal portions connecting the plurality of branch electrodes to each other.

According to one or more exemplary embodiment of the invention, the semiconductor layer is between the first gate insulating layer and the second gate insulating layer to reduce the interval between the semiconductor layer and the gate electrode, thereby improving the charge mobility.

Further, the semiconductor layer has a double-layer structure of the oxide semiconductor layer, and the first and second auxiliary layers on the oxide semiconductor layer, where the edges of the drain electrode and the source electrode are each inside the edges of the first auxiliary layer and the second auxiliary layer, thereby reducing the effect of the metal of the drain electrode and the source electrode on the oxide semiconductor layer during the forming of the drain electrode and the source electrode.

In addition, the resistance electrode includes the same metal as the data line and the first field generating electrode is connected to the resistance electrode, thereby reducing the electrical resistance of the first field generating electrode.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
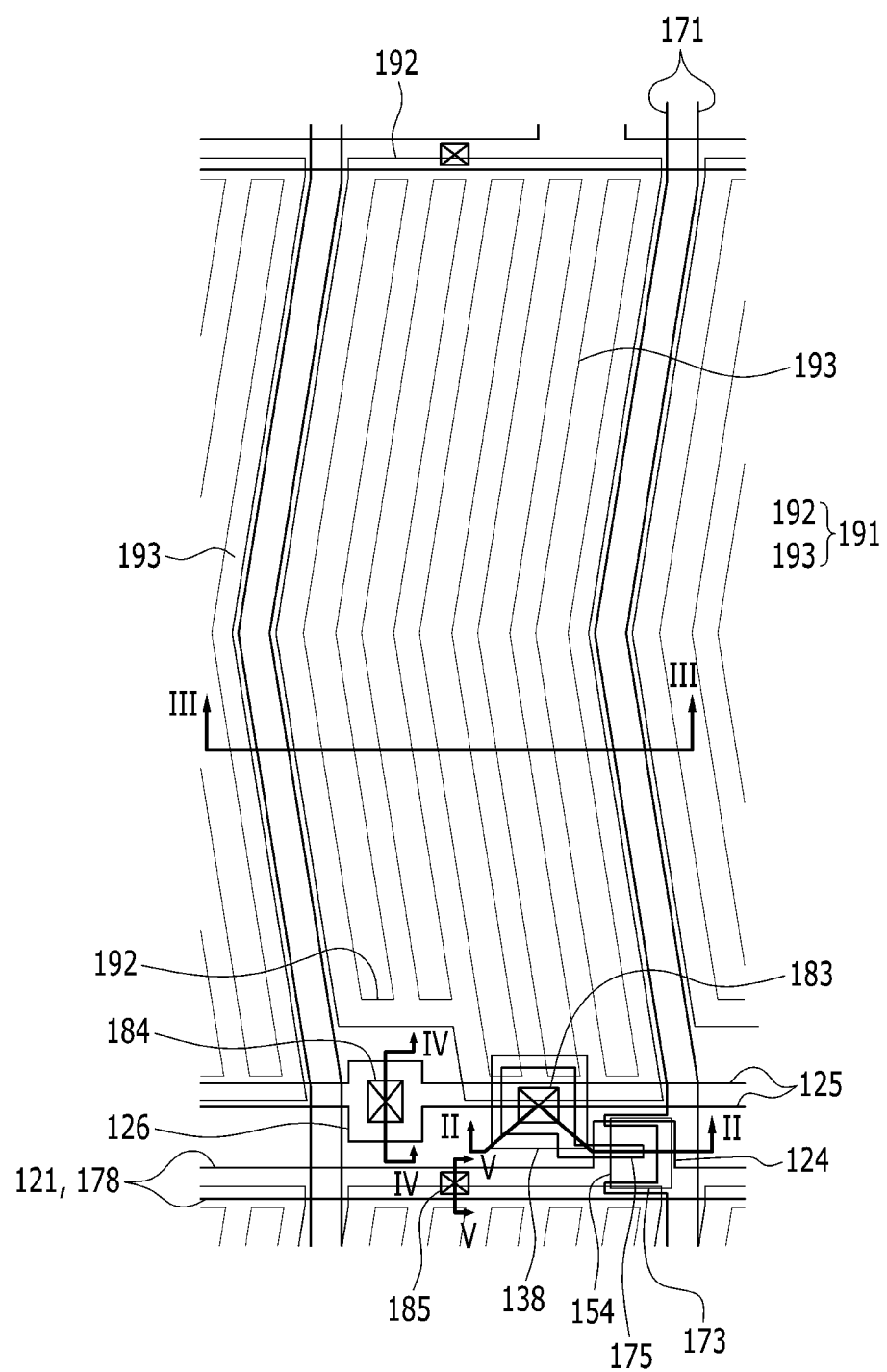
FIG. 1 is a plan view of an exemplary embodiment of a thin film transistor array panel according to the invention.

Hereinafter, exemplary embodiments of the invention will be described in detail with reference to the accompanying drawings. As those skilled in the art would realize, the described exemplary embodiments may be modified in various different ways, all without departing from the spirit or scope of the invention. On the contrary, exemplary embodiments introduced herein are provided to make disclosed contents thorough and complete and sufficiently transfer the spirit of the invention to those skilled in the art.

In addition, the size and thickness of each configuration shown in the drawings are arbitrarily shown for understanding and ease of description, but the invention is not limited thereto.

In the drawings, the thickness of layers, films, panels, regions, etc., are exaggerated for clarity. In the drawings, for understanding and ease of description, the thickness of some layers and areas is exaggerated. It will be understood that when an element such as a layer, film, region, or substrate is referred to as being "on" another element, it can be directly on the other element or intervening elements may also be present. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Spatially relative terms, such as "beneath," "lower," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "beneath" relative to other elements or features would then be oriented "above" relative to the other elements or features. Thus, the exemplary term "beneath" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. In addition, unless explicitly described to the contrary, the word "comprise" and variations such as "comprises" or "comprising", will be understood to imply the inclusion of stated elements but not the exclusion of any other elements.

Further, throughout the specification, a "plane shape" means when viewing an object portion from the top and a "cross section shape" means when viewing a cross section of an object portion vertically taken along from a side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the invention will be described in detail with reference to the accompanying drawings.

An exemplary embodiment of a thin film transistor array panel according to the invention will be described with reference to FIGS. 1 to 5.

Figure 2:
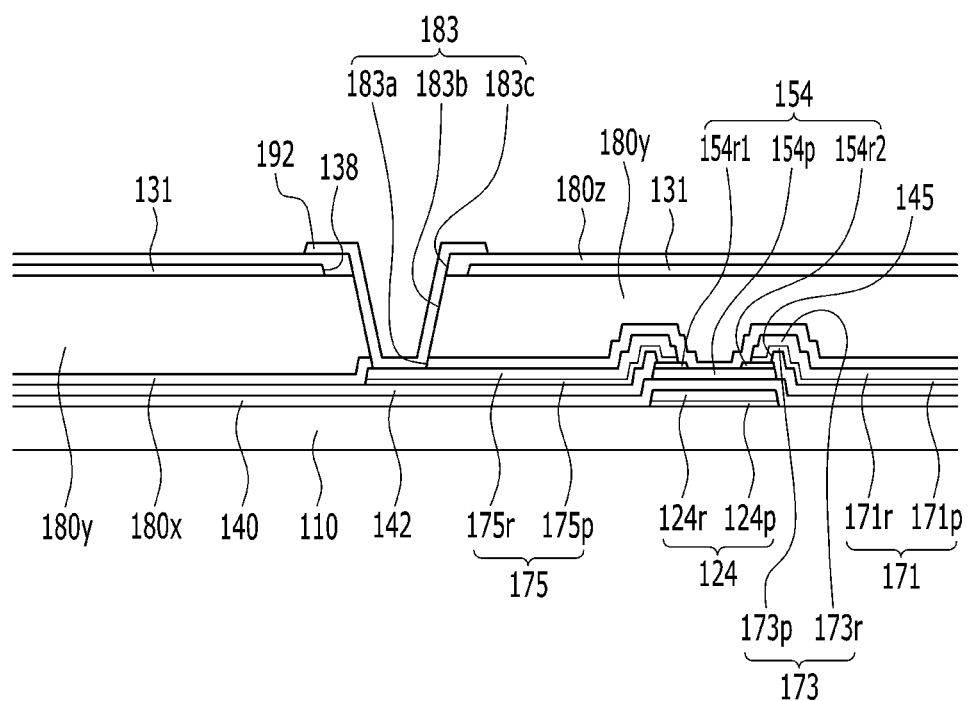
FIG. 2 is a cross-sectional view of the thin film transistor array panel of FIG. 1 taken along line II-II.
Figure 3:
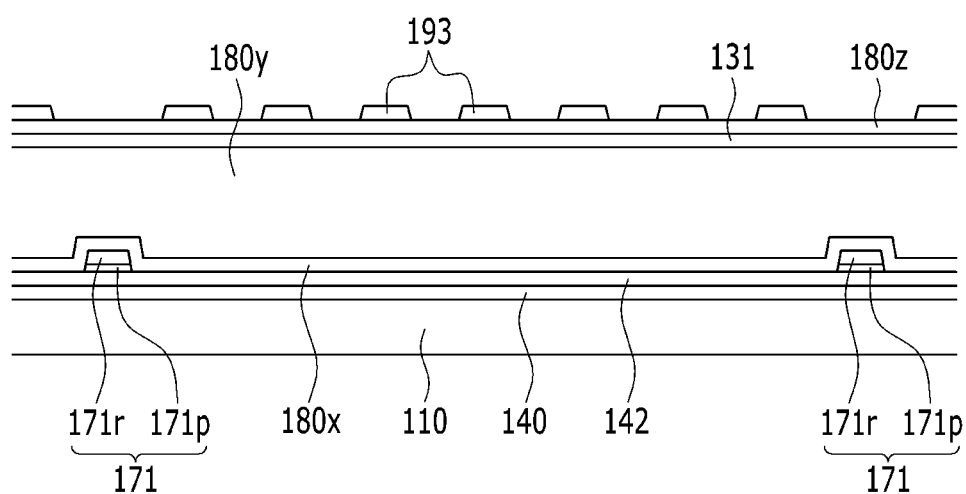
FIG. 3 is a cross-sectional view of the thin film transistor array panel of FIG. 1 taken along line III-III.
Figure 4:
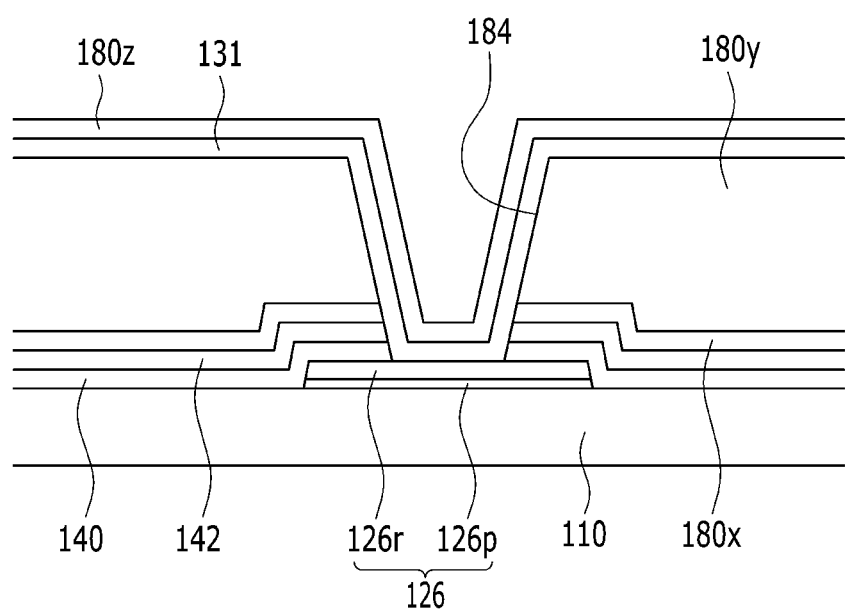
FIG. 4 is a cross-sectional view of the thin film transistor array panel of FIG. 1 taken along line IV-IV.
Figure 5:
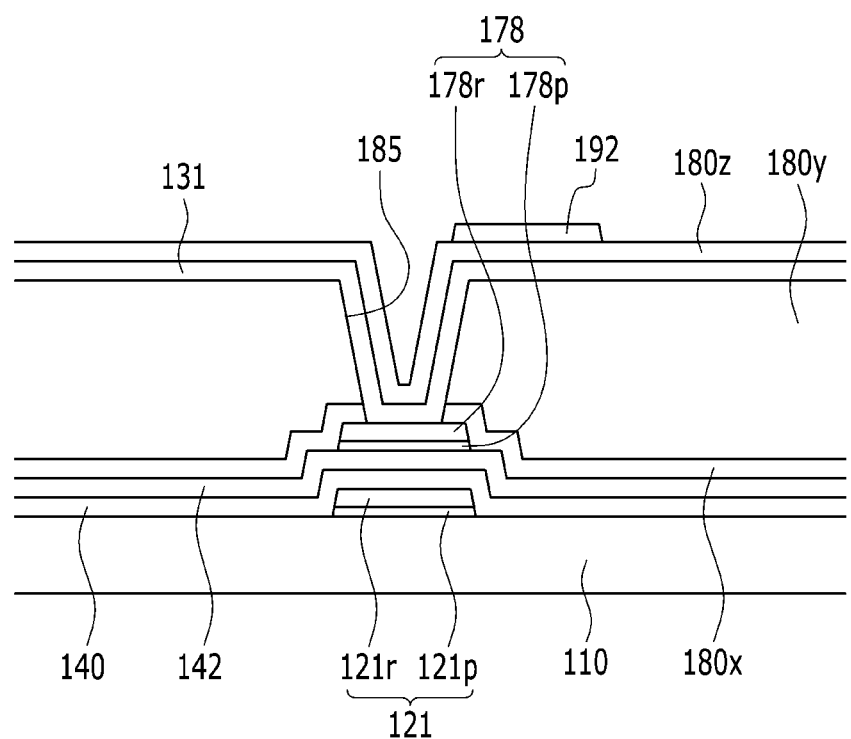
FIG. 5 is a cross-sectional view of the thin film transistor array panel of FIG. 1 taken along line V-V.
Figure 6:
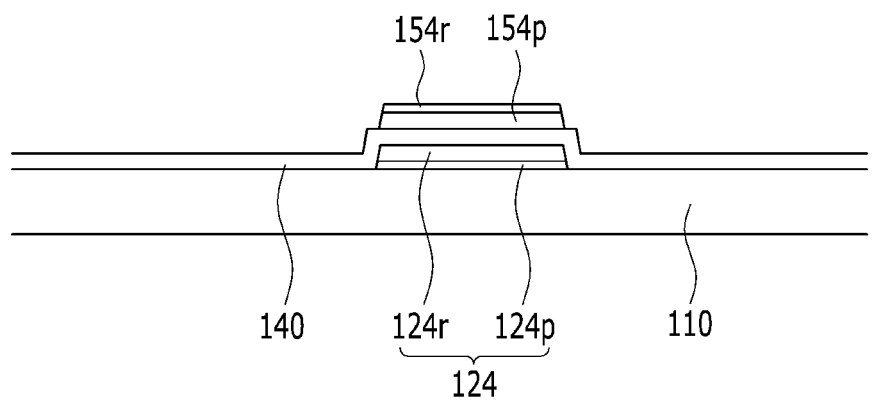
FIGS. 6 to 26 are cross-sectional views of an exemplary embodiment of a method for manufacturing a thin film transistor array panel according to the invention.
Figure 7:
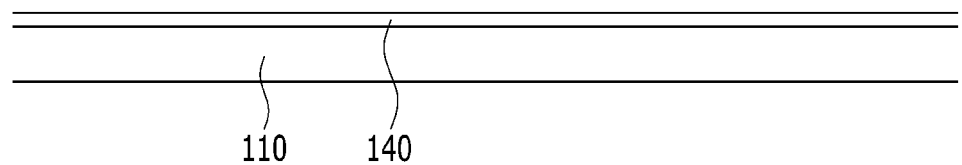
Figure 8:
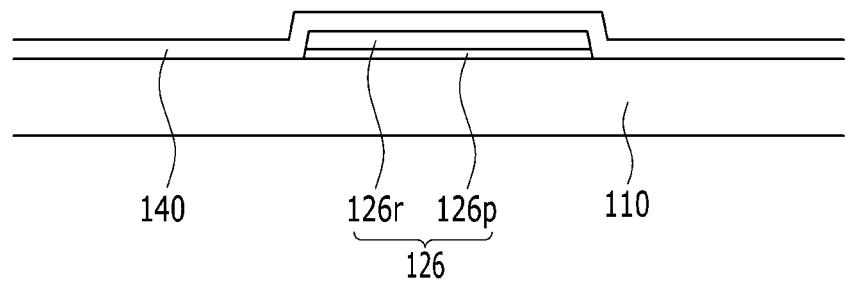
Figure 9:
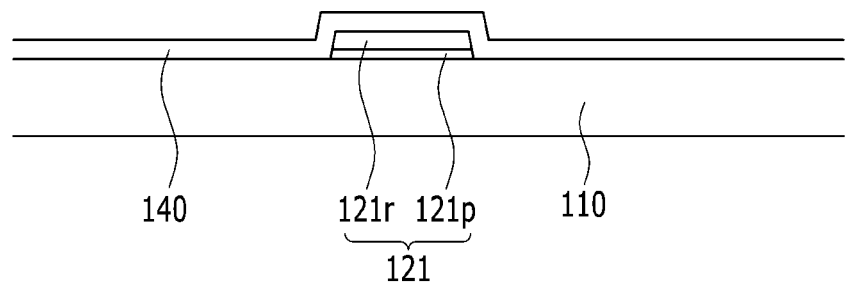
Figure 10:
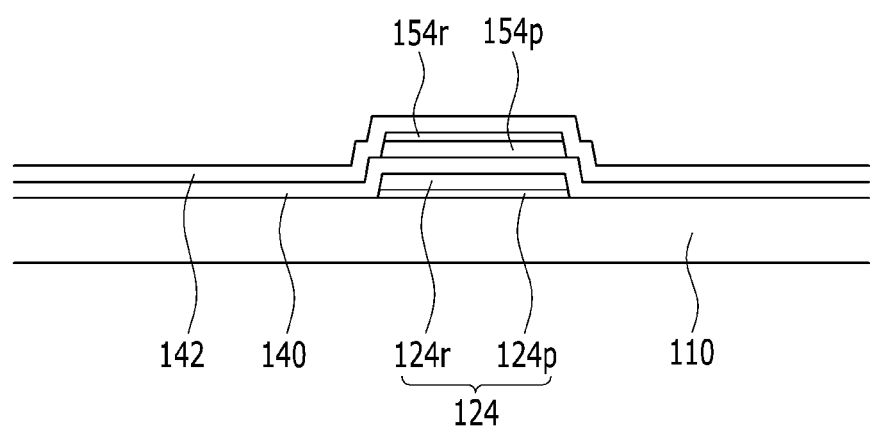
Figure 11:
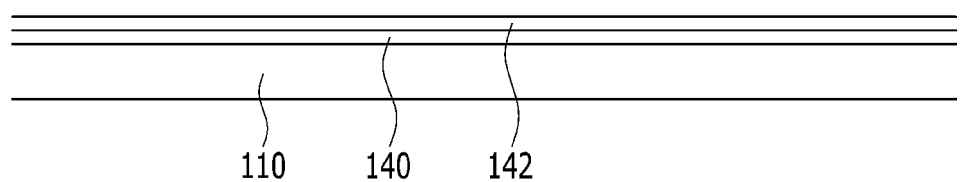
Figure 12:
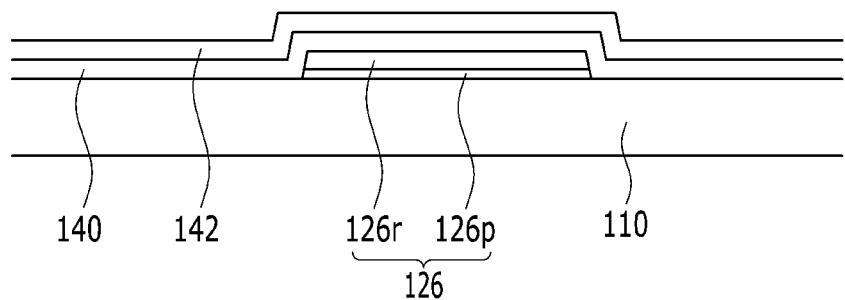
Figure 13:
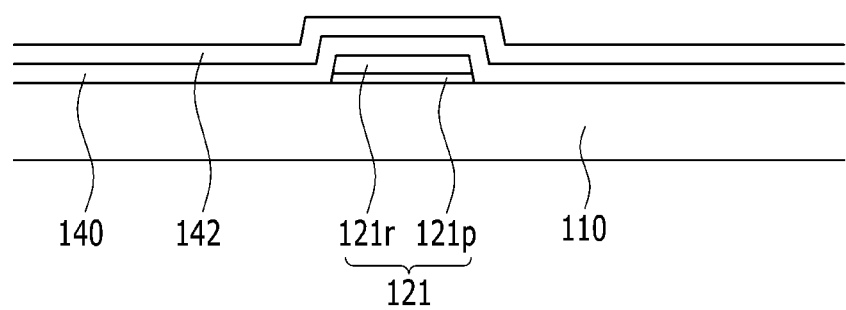
Figure 14:
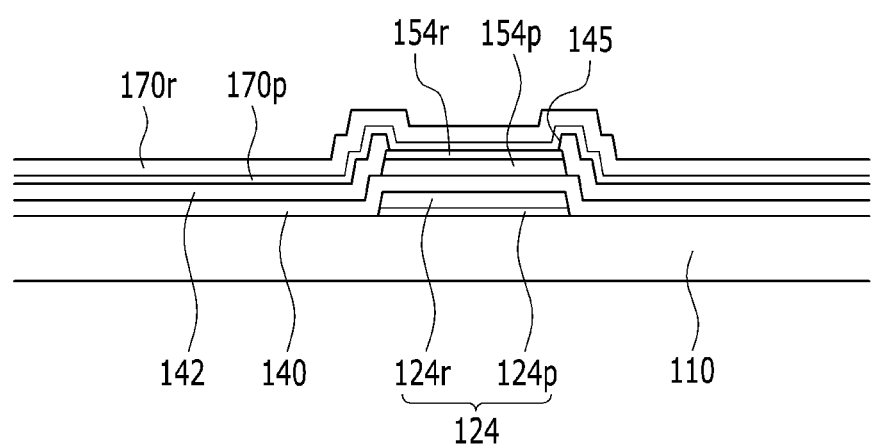
Figure 15:
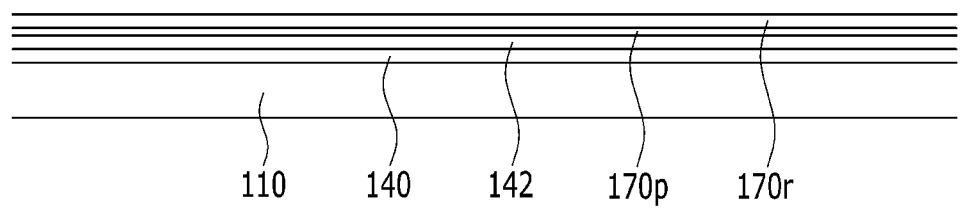
Figure 16:
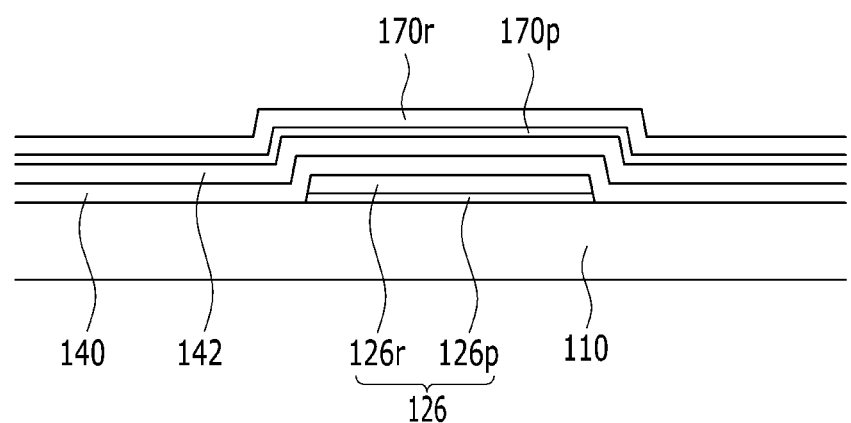
Figure 17:
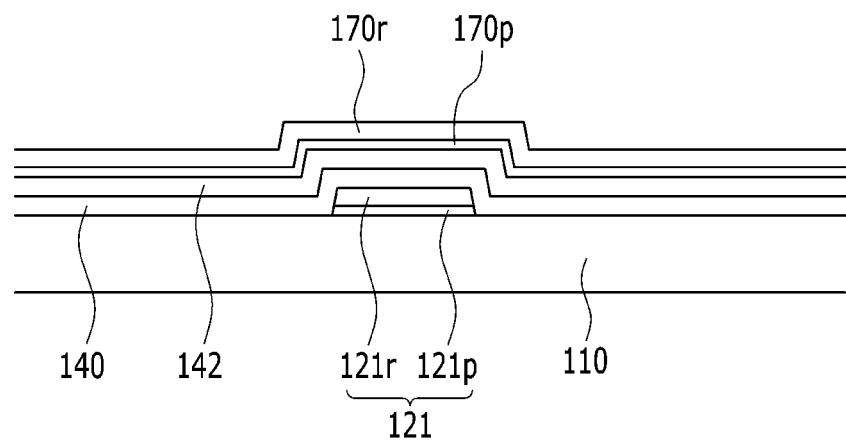
Figure 18:
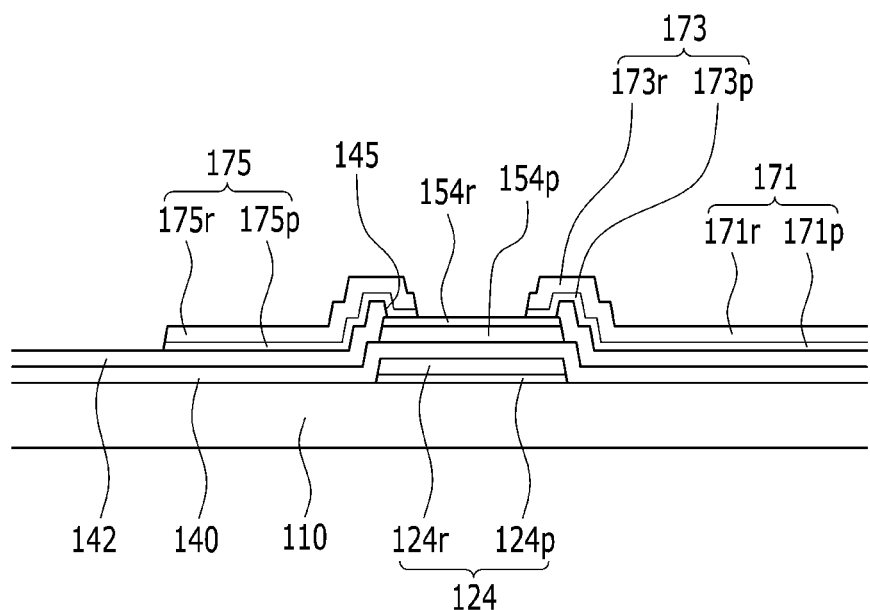
Figure 19:
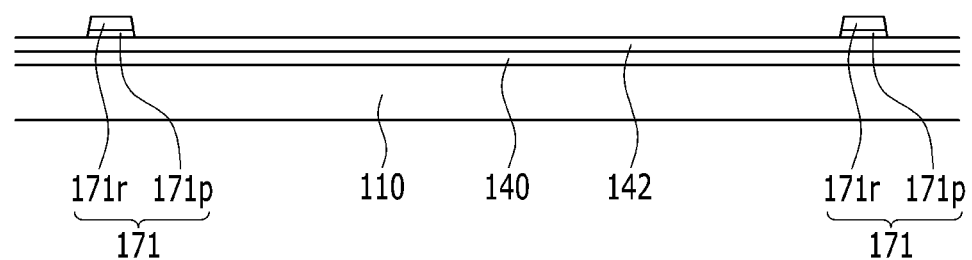
Figure 20:
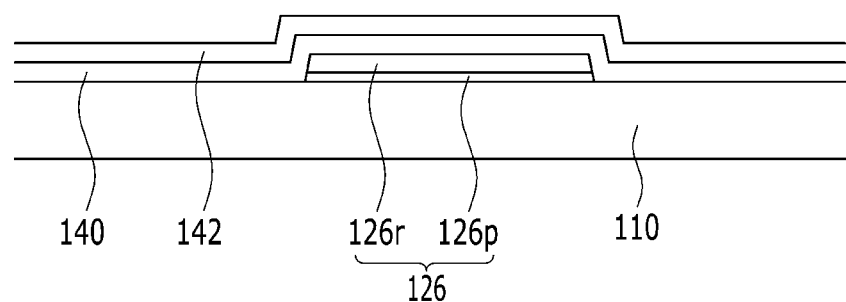
Figure 21:
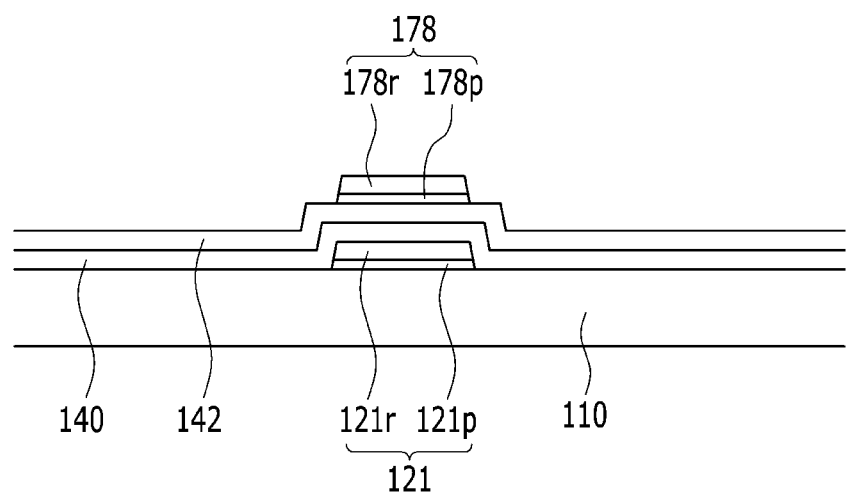

FIG. 1 is a plan view of an exemplary embodiment of a thin film transistor array panel according to the invention, FIG. 2 is a cross-sectional view of the thin film transistor array panel of FIG. 1 taken along line II-II, FIG. 3 is a cross-sectional view of the thin film transistor array panel of FIG. 1 taken along line III-III, FIG. 4 is a cross-sectional view of the thin film transistor array panel of FIG. 1 taken along line IV-IV, and FIG. 5 is a cross-sectional view of the thin film transistor array panel of FIG. 1 taken along line V-V.

Referring to FIGS. 1 to 5, a plurality of gate lines 121 and a plurality of reference voltage lines 125 which are separated from each other are disposed on an insulating substrate 110. The insulating substrate 100 may include transparent glass or plastic.

Each gate line 121 transmits gate signals, substantially extends horizontally in the plan view, and includes a plurality of protruding gate electrodes 124. Further, each gate line 121 may include a gate pad part (not shown) having a relatively wide plane area for connection with another layer or an external driving circuit (not shown). The gate line 121 includes an upper gate line portion 121r and a lower gate line portion 121p and the gate electrode 124 includes an upper gate electrode portion 124r and a lower gate electrode portion 124p.

Each reference voltage line 125 transmits a predetermined voltage such as reference voltage, may substantially extend in a horizontal direction in the plan view and may be substantially parallel with the gate line 121. Each reference voltage line 125 includes a plurality of extensions 126. The reference voltage line 125 includes an upper reference voltage line portion (not illustrated) and a lower reference voltage line portion (not illustrated) and the extension 126 includes an upper extension portion 126r and a lower extension portion 126p.

Herein, the upper gate line portion 121r, the upper gate electrode portion 124r and the upper extension portion 126r include copper (Cu) and are in a same layer. The lower gate line portion 121p, the lower gate electrode portion 124p and the lower extension portion 126p include titanium (Ti) or molybdenum (Mo) and are in a same layer. A cross-sectional thickness of the upper gate line portion 121r, the upper gate electrode portion 124r and the upper extension portion 126r is larger than that of the lower gate line portion 121p, the lower gate electrode portion 124p, and the lower extension portion 126p.

Further, the upper reference voltage line portion includes copper and is in the same layer as the upper gate line portion 121r, the upper gate electrode portion 124r and the upper extension portion 126r. The lower reference voltage line portion includes titanium or molybdenum and is in the same layer as the lower gate line portion 121p, the lower gate electrode portion 124p and the lower extension portion 126p. A cross-sectional thickness of the upper reference voltage line portion is larger than that of the lower reference voltage line portion.

A first gate insulating layer 140 is disposed on the gate line 121 and the reference voltage line 125. The first gate insulating layer 140 may include silicon oxide ($SiO_x$)

A semiconductor layer 154 is disposed at a portion corresponding to the gate electrode 124 and on the first gate insulating layer 140.

The semiconductor layer 154 includes an oxide semiconductor layer 154p, and a first auxiliary layer 154r1 and a second auxiliary layer 154r2 which are disposed on the oxide semiconductor layer 154p.

The oxide semiconductor layer 154p includes an oxide of zinc (Zn), gallium (Ga), tin (Sn) or indium (In), such as at least one of zinc oxide (ZnO), indium-gallium-zinc oxide ($InGaZnO_4$), indium-zinc oxide (Zn—In—O) and zinc-tin oxide (Zn—Sn—O) which are a composite oxide thereof.

The first auxiliary layer 154r1 and the second auxiliary layer 154r2 include titanium, molybdenum or an alloy of titanium-molybdenum and are separated from each other to be disposed at both edges of the oxide semiconductor layer 154p. That is, the first auxiliary layer 154r1 and the second auxiliary layer 154r2 expose a part of the oxide semiconductor layer 154p. A cross-sectional thickness of the first auxiliary layer 154r1 and the second auxiliary layer 154r2 is smaller than that of the oxide semiconductor layer 154p.

A second gate insulating layer 142 is disposed on the first gate insulating layer 140 and the semiconductor layer 154. The second gate insulating layer 142 includes silicon oxide ($SiO_x$). A semiconductor opening 145 is defined in the second gate insulating layer 142, through which the semiconductor layer 154 is exposed.

That is, the semiconductor layer 154 is disposed between the first gate insulating layer 140 and the second gate insulating layer 142. Therefore, an interval between the semiconductor layer 154 and the gate electrode 124 is smaller than that in the related art.

A plurality of data lines 171, a plurality of drain electrodes 175, and a plurality of resistance electrodes 178 are disposed on the second gate insulating layer 142 and the semiconductor layer 154.

Each data line 171 transfers a data signal and substantially extends in a vertical direction in the plan view to intersect the gate line 121 and the reference voltage line 125. Each data line 171 includes a plurality of source electrodes 173 which extends toward the gate electrode 124. Further, each data line 171 may include a data pad part (not shown) having a relatively wide area for connection with another layer or an external driving circuit (not shown).

In the plan view, the drain electrode 175 includes a bar-shaped first end facing the source electrode 173 and a second end opposite the first end and having a relatively wide planar area, based on the gate electrode 124.

A portion of the drain electrode 175 is disposed on the first auxiliary layer 154r1 and a portion of the source electrode 173 is disposed on the second auxiliary layer 154r2. An edge of the drain electrode 175 is disposed inside an edge of the first auxiliary layer 154r1 and an edge of the source electrode 173 is disposed inside an edge of the second auxiliary layer 154r2. That is, the edges and edge portion adjacent thereto of the first auxiliary layer 154r1 and the second auxiliary layer 154r2, are exposed by the inwardly-disposed drain electrode 175 and source electrode 173, respectively.

Due to a disposition structure of the drain electrode 175 and the source electrode 173 and the first auxiliary layer 154r1 and the second auxiliary layer 154r2, the effect of metal of the drain electrode 175 and the source electrode 173 on the oxide semiconductor layer 154p may be reduced, during manufacturing of the thin film transistor array panel.

The resistance electrode 178 overlaps the gate line 121 and extends in the same direction as the gate line 121.

The data line 171 includes an upper data line portion 171r and a lower data line portion 171p and the source electrode 173 includes an upper source electrode portion 173r and a lower source electrode 173p. The drain electrode 175 includes an upper drain electrode portion 175r and a lower drain electrode portion 175p and the resistance electrode 178 includes an upper resistance electrode portion 178r and a lower resistance electrode portion 178p.

Herein, the upper data line portion 171r, the upper source electrode portion 173r, the upper drain electrode portion 175r and the upper resistance electrode portion 178r include copper and are in a same layer. The lower data line portion 171p, the lower source electrode portion 173p, the lower drain electrode portion 175p and the lower resistance electrode portion 178p include titanium or molybdenum and are in a same layer. A cross-sectional thickness of the upper data line portion 171r, the upper source electrode portion 173r, the upper drain electrode portion 175r and the upper resistance electrode portion 178r is larger than that of the lower data line portion 171p, the lower source electrode portion 173p, the lower drain electrode portion 175p and the lower resistance electrode portion 178p.

In the plan view, the data line 171 is periodically bent and forms an oblique angle with respect to an extending direction of the gate line 121. The oblique angle of the data line 171 with respect to the extending direction of the gate line 121 may be equal to or more than about 45 degrees (°). However, in another exemplary embodiment of a thin film transistor array panel according to the invention, the data line 171 may extend straightly in the vertical direction and be substantially perpendicular to the extending direction of the gate line 121.

One gate electrode 124, one source electrode 173 and one drain electrode 175 form one thin film transistor ("TFT") along with the semiconductor layer 154. A channel of the TFT is formed by the semiconductor layer 154 exposed between the source electrode 173 and the drain electrode 175.

A first passivation layer 180x is disposed on the data line 171, the drain electrode 175, the resistance electrode 178, and the channel of the TFT. The first passivation layer 180x may include silicon oxide ($SiO_x$).

A second passivation layer 180y is disposed on the first passivation layer 180x. The second passivation layer 180y includes an organic insulating material and a surface of the second passivation layer 180y may be substantially planarized.

Although not illustrated, in another exemplary embodiment of a TFT array panel according to the invention, the second passivation layer 180y may be a color filter and a layer may be further disposed on the second passivation layer 180y as the color filter. In an exemplary embodiment, for example, the TFT array panel may further include a capping layer which is disposed on the color filter to reduce or effectively prevent introduction of a pigment of the color filter into the liquid crystal layer. The capping layer may include an insulating material such as silicon nitride (SiNx).

A first field generating electrode 131 is disposed on the second passivation layer 180y. The first field generating electrode 131 may include a transparent conductive material such as indium tin oxide ("ITO") and indium zinc oxide ("IZO").

According to the illustrated exemplary embodiment of the invention, the first field generating electrode 131 may have a plate shape. As a plate shape, branch electrodes are not defined therein. A passivation layer opening 138 is defined in the first field generating electrode 131 at a portion corresponding to a first contact hole 183.

A third passivation layer 180z is disposed on the first field generating electrode 131, and a second field generating electrode 191 is disposed thereon. The second field generating electrode 191 may include a transparent conductive material such as ITO and IZO.

The second field generating electrode 191 includes a plurality of branch electrodes 193, which substantially extend in parallel with each other and are spaced apart from each other, and lower and upper horizontal parts 192 which connect upper and lower ends of the plurality of branch electrodes 193 to each other. In the plan view, the branch electrode 193 of the second field generating electrode 191 may be bent along the data line 171, so as to be substantially parallel to the data line 171.

However, in another exemplary embodiment of the TFT array panel according to the invention, the data line 171 and the branch electrode 193 of the second field generating electrode 191 may each extend straightly.

The first contact hole 183 is defined in each of the first passivation layer 180x, the second passivation layer 180y and the third passivation layer 180z, through which a part of the drain electrode 175 is exposed. The first contact hole 183 includes a first portion 183a which is defined in the first passivation layer 180x, a second portion 183b which is defined in the second passivation layer 180y, and a third portion 183c which is defined in the third passivation layer 180z. A sidewall at the first contact hole 183 defined by surfaces of the first passivation layer 180x, the second passivation layer 180y and the third passivation layer 180z may be substantially linear, but the invention is not limited thereto.

The horizontal portion 192 of the second field generating electrode 191 is electrically connected to the drain electrode 175 through the first contact hole 183.

A second contact hole 184 is defined in each of the first passivation layer 180x, the second passivation layer 180y, the first gate insulating layer 140 and the second gate insulating layer 142, through which a part of the extension 126 of the reference voltage line 125 is exposed.

The first field generating electrode 131 is electrically connected to the extension 126 of the reference voltage line 125 through the second contact hole 184.

A third contact hole 185 is defined in each of the first passivation layer 180x and the second passivation layer 180y, through which a part of the resistance electrode 178 is exposed.

The first field generating electrode 131 is electrically connected to the resistance electrode 178 through the third contact hole 185.

The first field generating electrode 131 is connected to the reference voltage line 125 through the second contact hole 184 to be applied with a reference voltage from the reference voltage line 125, and the second field generating electrode 191 is connected to the drain electrode 175 through the first contact hole 183 to be applied with a data voltage from the data line 171. Further, the first field generating electrode 131 is connected to the resistance electrode 178 through the third contact hole 185 to reduce an electrical resistance of the first field generating electrode 131.

The first field generating electrode 131 and the second field generating electrode 191, which are applied with a common voltage and a data voltage, respectively, generate an electric field in a liquid crystal layer (not illustrated).

In the illustrated exemplary embodiment of the TFT array panel according to the invention, the plate-shaped first field generating electrode 131 is disposed beneath the third passivation layer 180z and the second field generating electrode 191 having the plurality of branch electrodes 193 is disposed above the third passivation layer 180z, but the invention is not limited thereto. In another exemplary embodiment of the TFT array panel according to the invention, the second field generating electrode 191 having the plurality of branch electrodes 193 may be disposed beneath the third passivation layer 180z and the plate-shaped first field generating electrode 131 may be disposed above the third passivation layer 180z. In still another exemplary embodiment of the TFT array panel according to the invention, the resistance electrode 178 connected to the first field generating electrode 131 is omitted.

Further, in exemplary embodiments, any one of the first field generating electrode 131 and the second field generating electrode 191 may include the plurality of branch electrodes, and the other one may have a plate shape absent the plurality of branch electrodes.

Further, any one of the first field generating electrode 131 and the second field generating electrode 191 may be applied with the reference voltage, and the other one may be applied with the data voltage.

That is, all the features of the above-described exemplary embodiment of a TFT array panel according to the invention may be applied to devices in which both the common electrode and the pixel electrode, which are two field generating electrodes, are disposed in the single TFT array panel.

The first gate insulating layer 140 and the second gate insulating layer 142 are disposed between the source electrode 173 and the gate electrode 124 and between the drain electrode 175 and the gate electrode 124. The semiconductor layer 154 is disposed between the first gate insulating layer 140 and the second gate insulating layer 142 to reduce the interval between the semiconductor layer 154 and the gate electrode 124, while maintaining the respective intervals between the source electrode 173 and the drain electrode 175, and the gate electrode 124 of the related art, thereby improving the charge mobility. Therefore, one or more exemplary embodiment secures the characteristics of the TFT.

Further, the semiconductor layer 154 has a double-layer structure including the oxide semiconductor layer 154p, and the first and second auxiliary layers 154r1 and 154r2, where the edges of the drain electrode 175 and the source electrode 173 are each disposed inside the edges of the first auxiliary layer 154r1 and the second auxiliary layer 154r2, thereby reducing the effect of metal of the drain electrode 175 and the source electrode 173 on the oxide semiconductor layer 154p during forming the drain electrode 175 and the source electrode 173 in manufacturing the TFT array panel.

In addition, the resistance electrode 178 including the same metal as the data line 171 and the first field generating electrode 131 is connected to the resistance electrode 178, thereby reducing the electrical resistance of the first field generating electrode 131.

Next, an exemplary embodiment of a method for manufacturing a TFT array panel according to the invention will be described with reference to FIGS. 6 to 26 along with FIGS. 2 to 5.

FIGS. 6 to 26 are cross-sectional views of an exemplary embodiment of a method for manufacturing a TFT array panel according to the invention.

Referring to FIGS. 6 to 9 as views taken along II-II, III-III, IV-IV and V-V of FIG. 1, respectively, a gate line 121 including a gate electrode 124 and an extension 126, are formed on an insulating substrate 110, a first gate insulating layer 140 is formed on the gate line 121 and the extension 126. An oxide semiconductor layer 154p and an auxiliary material layer 154r are formed at a part corresponding to the gate electrode 124, on the first gate insulating layer 140. Further, although not illustrated, at the time of forming the extension 126, a reference voltage line 125 is also formed.

The gate line 121 includes an upper gate line portion 121r and a lower gate line portion 121p and the gate electrode 124 includes an upper gate electrode portion 124r and a lower gate electrode portion 124p. The extension 126 includes an upper extension portion 126r and a lower extension portion 126p.

Herein, the upper gate line portion 121r, the upper gate electrode portion 124r and the upper extension portion 126r include copper (Cu) and are in a same single layer. The lower gate line portion 121p, the lower gate electrode portion 124p and the lower extension portion 126p include titanium or molybdenum and are in a same single layer. The cross-sectional thickness of the upper gate line portion 121r, the upper gate electrode portion 124r and the upper extension portion 126r is larger than that of the lower gate line portion 121p, the lower gate electrode portion 124p, and the lower extension portion 126p, respectively.

The first gate insulating layer 140 includes of silicon oxide.

The oxide semiconductor layer 154p includes an oxide zinc, gallium, tin or indium such as at least one of zinc oxide, indium-gallium-zinc oxide, indium-zinc oxide, and zinc-tin oxide which are a composite oxide thereof. The auxiliary material layer 154r includes titanium, molybdenum, or an alloy of titanium-molybdenum. The cross-sectional thickness of the oxide semiconductor layer 154p is larger than that of the auxiliary material layer 154r.

Referring to FIGS. 10 to 13 as views taken along II-II, III-III, IV-IV and V-V of FIG. 1, respectively, a second gate insulating layer 142 is formed on the first gate insulating layer 140 and the auxiliary material layer 154r, by using silicon oxide.

Referring to FIGS. 14 to 17 as views taken along II-II, III-III, IV-IV and V-V of FIG. 1, respectively, after the auxiliary material layer 154r is exposed by the second gate insulating layer 142, a lower data metal layer 170p and an upper data metal layer 170r are sequentially formed on the second gate insulating layer 142 and the exposed auxiliary layer 154r.

The lower data metal layer 170p includes titanium or molybdenum and the upper data metal layer 170r includes copper. The upper data metal layer 170r is formed to be thicker than the lower data metal layer 170p.

Referring to FIGS. 18 to 21 as views taken along II-II, III-III, IV-IV and V-V of FIG. 1, respectively, a data line 171 including a source electrode 173, and a resistance electrode 178 are formed by etching the upper data metal layer 170r and the lower data metal layer 170p.

The data line 171 includes an upper data line portion 171r and a lower data line portion 171p and the source electrode 173 includes an upper source electrode portion 173r and a lower source electrode portion 173p. The drain electrode 175 includes an upper drain electrode portion 175r and a lower drain electrode portion 175p and the resistance electrode 178 includes an upper resistance electrode portion 178r and a lower resistance electrode portion 178p.

The drain electrode 175 and the source electrode 173 are separated from each other, face each other with respect to the gate electrode 124, and expose the auxiliary material layer 154r.

The resistance electrode 178 overlaps the gate line 121.

Figure 22:
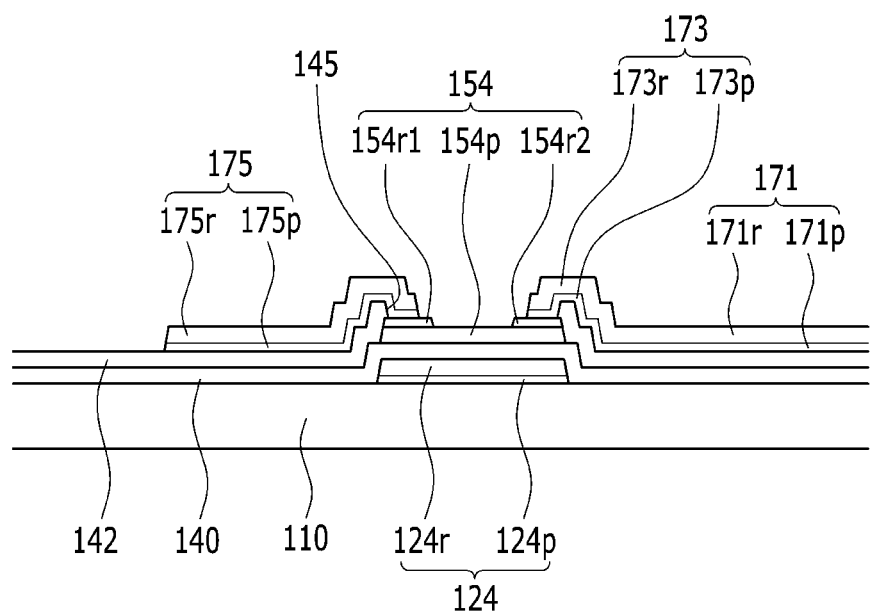
Figure 23:
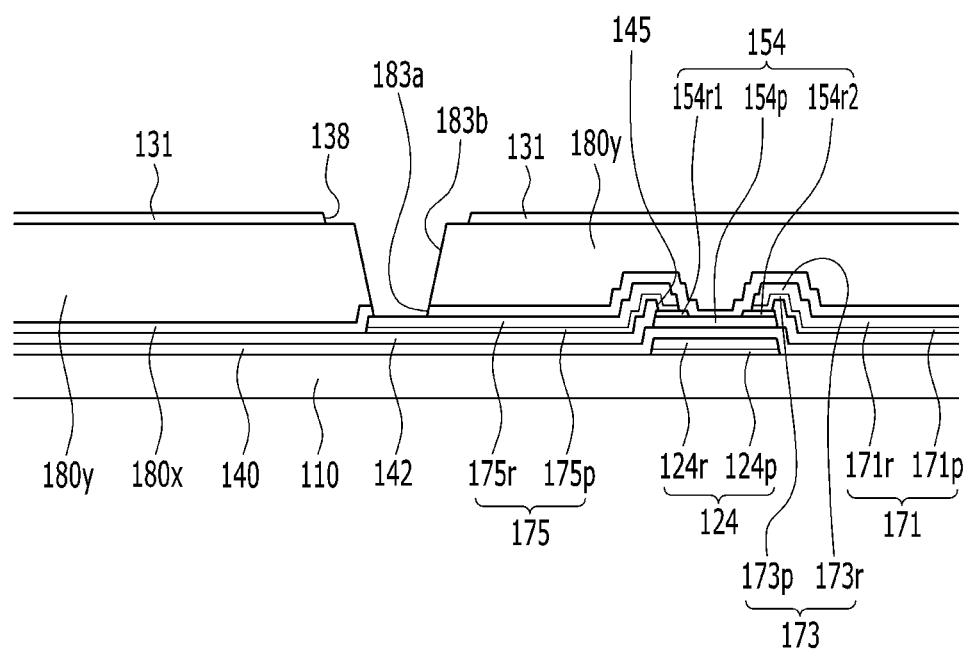
Figure 24:
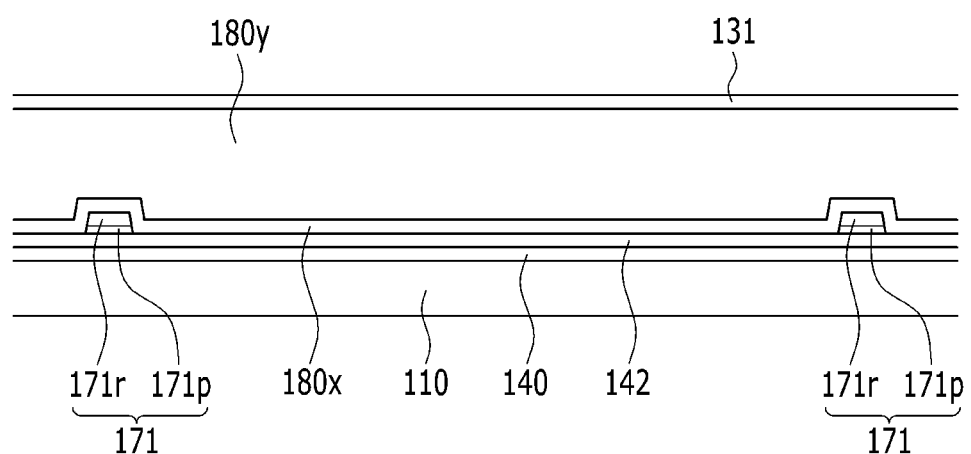
Figure 25:
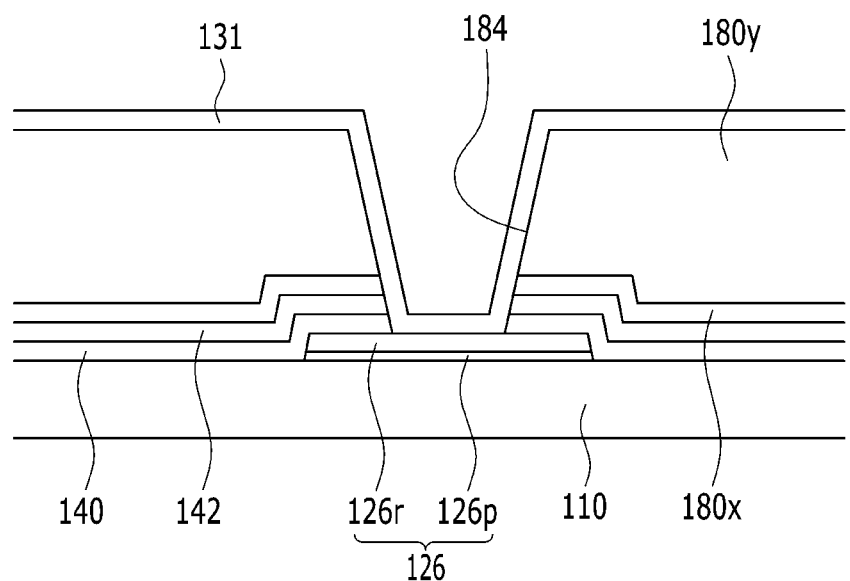
Figure 26:
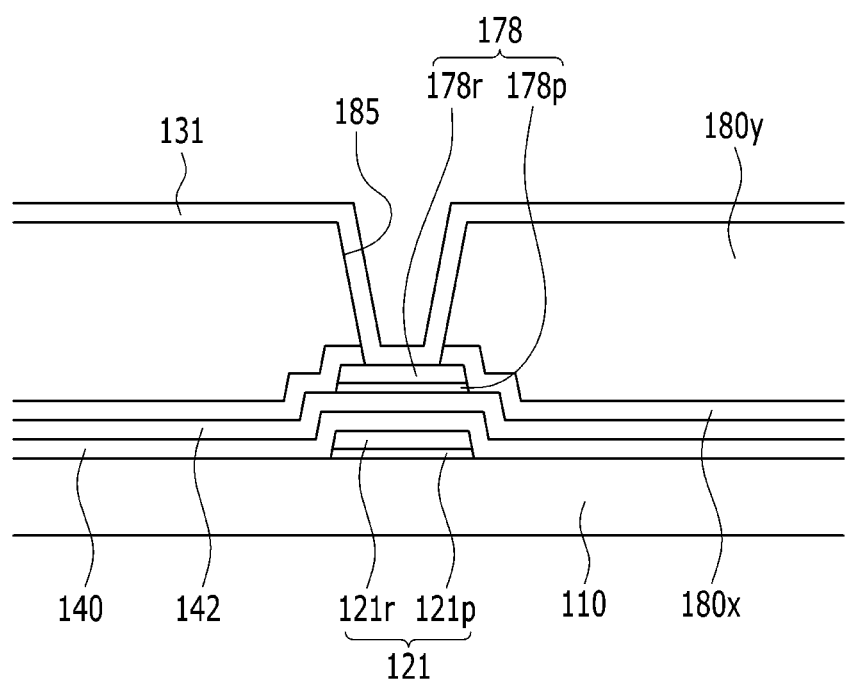

Referring to FIG. 22 as a partial view taken along II-II of FIG. 1, a first auxiliary layer 154r1 and a second auxiliary layer 154r2 exposing the oxide semiconductor layer 154p are formed by etching the auxiliary material layer 154r exposed by the drain electrode 175 and the source electrode 173. Herein, the first auxiliary layer 154r1 and the second auxiliary layer 154r2, and the oxide semiconductor layer 154p collectively form a semiconductor layer 154.

When the lower data metal layer 170p and the upper data metal layer 170r are etched (refer to FIG. 18), the lower data metal layer 170p and the upper data metal layer 170r undergo a wet etch by using a photosensitive film pattern (not illustrated) as a mask and the edges of the drain electrode 175 and the source electrode 173 are disposed inside the edges of the photosensitive film pattern. That is, the edges of the drain electrode 175 and the source electrode 173 are disposed in different positions than the edges of the photosensitive film pattern.

Next, referring again to FIG. 22, when the auxiliary layer 154r undergoes a dry etch by using the same photosensitive film pattern used in etching the lower data metal layer 170p and the upper data metal layer 170r, the edge of the photosensitive film pattern and the edges of the first auxiliary layer 154r1 and the second auxiliary layer 154r2 are disposed at the same position when viewed from a plane. That is, edges of the drain electrode 175 and the source electrode 173 are offset from the edges of the first auxiliary layer 154r1 and the second auxiliary layer 154r2, even though the same photosensitive film pattern is used to form these elements.

Therefore, the edge of the drain electrode 175 is disposed inside the edge of the first auxiliary layer 154r1 and the edge of the source electrode 173 is disposed inside the edge of the second auxiliary layer 154r2, in the plan view.

Referring to FIGS. 23 to 26 as views taken along II-II, III-III, IV-IV and V-V of FIG. 1, respectively, a first passivation layer 180x is formed on the data line 171, the drain electrode 175, the resistance electrode 178 and the exposed oxide semiconductor layer 154p by using silicon oxide. A second passivation layer 180y is formed on the first passivation layer 180x by using an organic insulating material.

A first portion 183a of a first contact hole 183 is formed in the first passivation layer 180x and a second portion 183b of the first contact hole 183 is formed in the second passivation layer 180y. The first portion 183a and the second portion 183b expose a part of the drain electrode 175.

Further, a second contact hole 184 is formed in the first passivation layer 180x, the second passivation layer 180y, the first gate insulating layer 140 and the second gate insulating layer 142 to expose a part of the extension 126.

Further, a third contact hole 185 is formed in the first passivation layer 180x and the second passivation layer 180y to expose a part of the resistance electrode 178.

Next, a first field generating electrode 131 is formed on the second passivation layer 180y. The first field generating electrode 131 is connected to the extension 126 through the second contact hole 184 and is connected to the resistance electrode 178 through the third contact hole 185.

Further, a passivation layer opening 138 is formed in the first field generating electrode 131. The passivation layer opening 138 is formed at the first portion 183a of the first contact hole 183 and the second portion 183b of the first contact hole 183. The passivation layer opening 138 exposes the first portion 183a of the first contact hole 183 and the second portion 183b of the first contact hole 183.

Referring again to FIGS. 3 to 5, a third passivation layer 180z is formed on the second passivation layer 180y. The third passivation layer 180z includes a third portion 183c of the first contact hole 183. The third portion 183c of the first contact hole 183 extends from the second portion 183b of the first contact hole 183.

Next, a second field generating electrode 191 including a plurality of branch electrodes 193 and a horizontal portion 192 is formed on the third passivation layer 180z. The horizontal portion 192 of the second field generating electrode 191 is connected to the drain electrode 175 through the first contact hole 183.

While this invention has been described in connection with what is presently considered to be practical exemplary embodiments, it is to be understood that the invention is not limited to the disclosed exemplary embodiments, but, on the contrary, is intended to cover various modifications and equivalent arrangements included within the spirit and scope of the appended claims.

What is claimed is:

1. A thin film transistor array panel, comprising:
an insulating substrate;
a gate line on the insulating substrate and comprising a gate electrode;
a reference voltage line on the insulating substrate, separated from the gate line and comprising an extension;
a first gate insulating layer on the insulating substrate, the gate line and the reference voltage line;
a semiconductor layer on the first gate insulating layer and overlapping the gate electrode;
a second gate insulating layer on the semiconductor layer and the first gate insulating layer, and a semiconductor opening defined in the second gate insulating layer and through which the semiconductor layer is exposed;
a data line comprising a source electrode;
a drain electrode on the second gate insulating layer and the semiconductor layer, and facing the source electrode;
a first passivation layer on the data line, the drain electrode and the second gate insulating layer;
a second passivation layer on the first passivation layer;
a first field generating electrode on the second passivation layer;
a third passivation layer on the first field generating electrode;
a first contact hole defined in the first passivation layer, the second passivation layer and the third passivation layer and exposing the drain electrode; and
a second field generating electrode on the third passivation layer and connected to the drain electrode through the first contact hole,
wherein
the semiconductor layer comprises an oxide semiconductor layer, and a first auxiliary layer and a second auxiliary layer disposed on the oxide semiconductor layer and separated from each other,
an edge of the drain electrode exposes an edge of the first auxiliary layer in a plan view, and
an edge of the source electrode exposes an edge of the second auxiliary layer in the plan view.

2. The thin film transistor array panel of claim 1, wherein the first gate insulating layer, the second gate insulating layer and the first passivation layer comprise silicon oxide.

3. The thin film transistor array panel of claim 2, wherein the first auxiliary layer and the second auxiliary layer comprise titanium, molybdenum or an alloy of titanium-molybdenum.

4. The thin film transistor array panel of claim 3, further comprising a second contact hole defined in the first gate insulating layer, the second gate insulating layer, the first passivation layer and the second passivation layer and through which the extension is exposed.

5. The thin film transistor array panel of claim 4, wherein the first field generating electrode is connected to the extension through the second contact hole.

6. The thin film transistor array panel of claim 5, wherein the second field generating electrode comprises a plurality of branch electrodes, and horizontal portions connecting the plurality of branch electrodes to each other.

7. The thin film transistor array panel of claim 6, wherein the second passivation layer comprises an organic insulating material.

8. The thin film transistor array panel of claim 1, further comprising a resistance electrode comprising a same material as the data line and in a same layer as the data line.

9. The thin film transistor array panel of claim 8, wherein the resistance electrode overlaps the gate line.

10. The thin film transistor array panel of claim 9, further comprising a third contact hole defined in the first passivation layer and the second passivation layer and through which the resistance electrode is exposed.

11. The thin film transistor array panel of claim 10, wherein the first field generating electrode is connected to the resistance electrode through the third contact hole.

12. A method for manufacturing a thin film transistor array panel, comprising:
    forming a gate line comprising a gate electrode, and a reference voltage line separated from the gate line and comprising an extension, on an insulating substrate;
    forming a first gate insulating layer on the insulating substrate, the gate line, the gate electrode and the reference voltage line;
    sequentially forming an oxide semiconductor layer and an auxiliary material layer on the gate electrode and the first gate insulating layer;
    forming a second gate insulating layer on the auxiliary material layer and the first gate insulating layer, and a semiconductor opening defined in the second gate insulating layer to expose the auxiliary material layer;
    forming a data metal layer on the second gate insulating layer and the exposed auxiliary material layer;
    forming a data line comprising a source electrode, a drain electrode facing the source electrode, and a resistance electrode, by etching the data metal layer;
    forming a first auxiliary layer and a second auxiliary layer separated from each other to expose the oxide semiconductor layer, by etching the auxiliary material layer;
    sequentially forming a first passivation layer and a second passivation layer on the data line, the drain electrode, the resistance electrode and the exposed oxide semiconductor layer;
    forming a first field generating electrode on the second passivation layer;
    forming a third passivation layer on the first field generating electrode; and
    forming a second field generating electrode on the third passivation layer and connected to the drain electrode,
    wherein
    an edge of the drain electrode exposes an edge of the first auxiliary layer in a plan view, and
    an edge of the source electrode exposes an edge of the second auxiliary layer in the plan view.

13. The method of claim 12, wherein the first gate insulating layer, the second gate insulating layer and the first passivation layer comprise silicon oxide.

14. The method of claim 13, wherein the auxiliary material layer comprises titanium, molybdenum or an alloy of titanium-molybdenum.

15. The method of claim 14, wherein
    the etching the data metal layer comprises a wet etch, and
    the etching the auxiliary material layer comprises a dry etch.

16. The method of claim 15, further comprising forming a first contact hole in the first passivation layer, the second passivation layer and the third passivation layer to expose the drain electrode,
    wherein the first field generating electrode is connected to the drain electrode through the first contact hole.

17. The method of claim 16, further comprising forming a second contact hole in the first gate insulating layer, the second gate insulating layer, the first passivation layer and the second passivation layer to expose the extension,
    wherein the first field generating electrode is connected to the extension through the second contact hole.

18. The method of claim 17, further comprising forming a third contact hole in the first passivation layer and the second passivation layer to expose the resistance electrode,
    wherein
    the resistance electrode overlaps the gate line, and
    the first field generating electrode is connected to the resistance electrode through the third contact hole.

19. The method of claim 18, wherein the forming the second field generating electrode comprises forming a plurality of branch electrodes, and horizontal portions connecting the plurality of branch electrodes to each other.

20. The method of claim 19, wherein the second passivation layer comprises an organic insulating material.

* * * * *